United States Patent [19]

Madland et al.

[11] 4,028,696
[45] June 7, 1977

[54] DOUBLE DEPRESSION MAGNETIC KEYSWITCH

[75] Inventors: Robert Christen Madland, Mount Prospect; Robert Michael Zielinski, Jr., Schaumberg; Keith Allen Engstrom, Arlington Heights, all of Ill.

[73] Assignee: Illinois Tool Works Inc., Chicago, Ill.

[22] Filed: Jan. 26, 1976

[21] Appl. No.: 652,450

[52] U.S. Cl. .............................. 340/365 L; 178/79; 340/365 R; 178/101
[51] Int. Cl.² .......................................... G08C 1/00
[58] Field of Search .................... 340/365 L, 365 R; 335/207; 178/79–81, 101

[56] References Cited
UNITED STATES PATENTS

| | | | |
|---|---|---|---|
| 3,407,396 | 10/1968 | Lukianov | 340/365 L |
| 3,698,531 | 10/1972 | Bernin | 340/365 L |
| 3,911,429 | 10/1975 | Vinal | 340/365 L |

Primary Examiner—Marshall M. Curtis
Attorney, Agent, or Firm—Glenn W. Bowen; Robert W. Beart

[57] ABSTRACT

A keyswitch for a keyboard which may generate either a first signal or a second signal is formed by a pair of saturable magnetic cores and corresponding drive and sense line wires that are molded into a unitary support assembly in a keyswitch housing. A plunger and a magnet assembly that is depressible relative to the housing and which supports at least one permanent magnet and a pair of compressible springs allows for the unsaturation of one core and the compression of one spring upon depression of the plunger to a first position and for the unsaturation of the second core by the compression of the second spring upon further depression of the plunger and magnet assembly to a character second position.

12 Claims, 6 Drawing Figures

DOUBLE DEPRESSION MAGNETIC KEYSWITCH

BACKGROUND OF THE INVENTION

The present invention relates to keyboard switches of the double depression type which are commonly found on keyboards whereby depression of the actuator of the keyswitch to a first position causes a representation of the character to be reproduced, while further depression of the actuator to a second position causes the representation to be cyclically repeated as long as the actuator remains depressed.

More particularly, the present invention relates to a switch of the described type in which depression of the actuator to the first position alters the location of a magnetic field, produced by one or more permanent magnets secured to the actuator, relative to a first magnetic core in order to permit inductive coupling between a drive line wire and a first sense line wire that thread the first core so as to provide a first signal, or a "single character" signal; in which depression of the actuator further to the second position alters the location of the magnetic field relative to both the first magnetic core and to a second magnetic core in order to permit inductive coupling between the drive line wire and the first sense line wire and also between the drive line wire and the second sense line wire which thread a second magnetic core so as to provide a second signal, or a "repeat character" signal.

U.S. patent application Ser. No. 525,416 filed Nov. 20, 1974 in the names of Victor Bernin, Robert Madland and C. Knoll and entitled, "Magnetic Keyswitch" is a continuation of U.S. patent application Ser. No. 474,571 filed May 30, 1974 and now abandoned, which in turn was a Continuation of U.S. patent application Ser. No. 388,510 filed Aug. 15, 1973 and also now abandoned. These applications show a magnetic switch which utilizes a single saturable magnetic core that is mounted in a unitary insulating support assembly which also supports the drive line and sense line wires.

A unitary support assembly is a highly desirable feature for many applications since the depressible actuator and key stem of the switch can easily be separated from the magnetic core and its associated sense and drive line wires so that components of the switch, such as a return spring, can be replaced without complete dismantling of the switch, in particular, without unsoldering the drive and sense line wires from a printed circuit board to which they are connected. Accordingly, it is an object of the present invention to provide a double depression magnetic keyswitch which employs a unitary support assembly.

The unitary support assembly of the aforementioned U.S. application Ser. No. 525,416 also was constructed with integrally formed cantilever shaped resilient braces which supported the magnetic core in such a manner that the braces were free to yield so as to relieve molding pressures on the core which might otherwise result from shrinkage during molding of the support assembly. It is therefore another object of the present invention to provide a double depression magnetic keyswitch in which molding pressures are relieved from both of the magnetic cores of the switch.

In addition to the foregoing objects, the present invention has a further object of providing the desired double depression switch in a manner such that it utilizes a minimum of parts and such that the support assembly for the switch may be retained in the same housing as the switch of the aforementioned Bernin et al patent applications.

DESCRIPTION OF THE DRAWINGS

The present invention is illustrated by reference to the drawings in which.

TECHNICAL DESCRIPTION OF THE INVENTION

Figure 1:
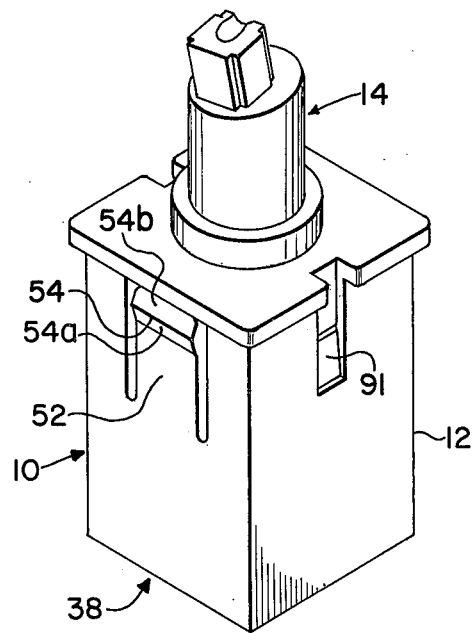
FIG. 1 is a perspective view of the assembled switch of the present invention.
Figure 6:
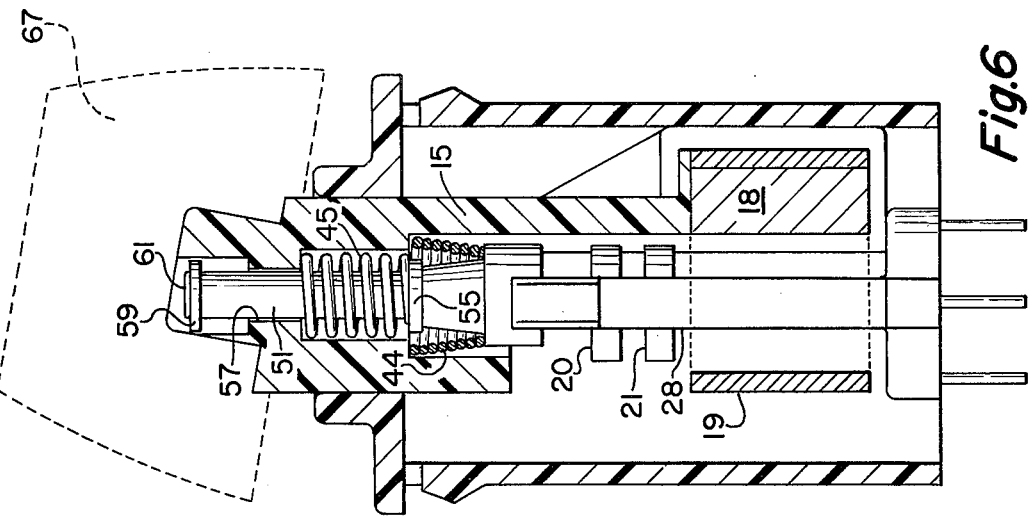
FIG. 6 is a cross-sectional view taken along lines 6—6 of FIG. 3 with the actuator button depressed to the second or "character repeat" position.
Figure 5:
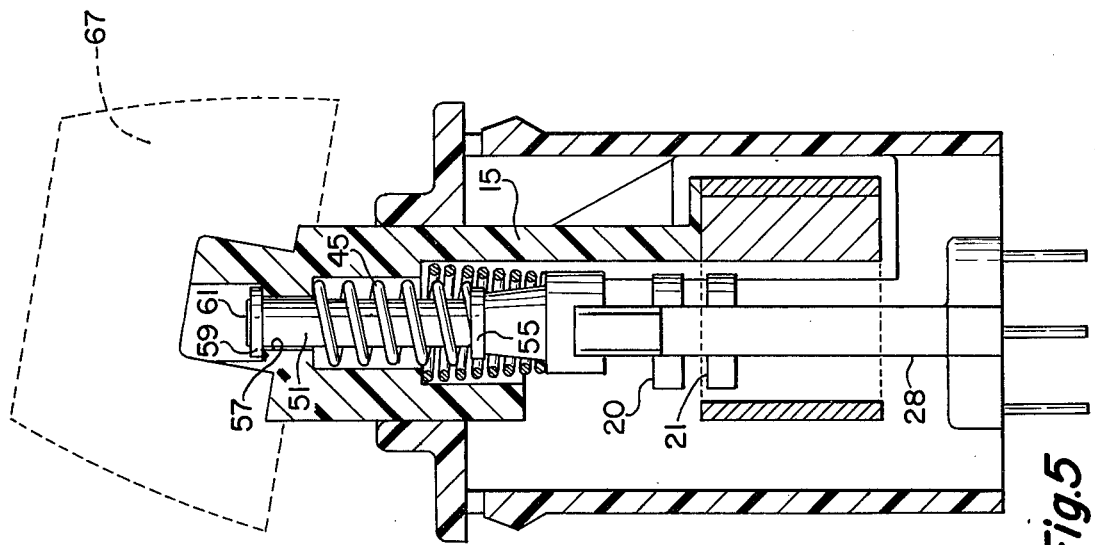
FIG. 5 is a cross-sectional view taken along the lines 5—5 of FIG. 3 with the actuator button depressed to the first or "single character" position.
Figure 4:
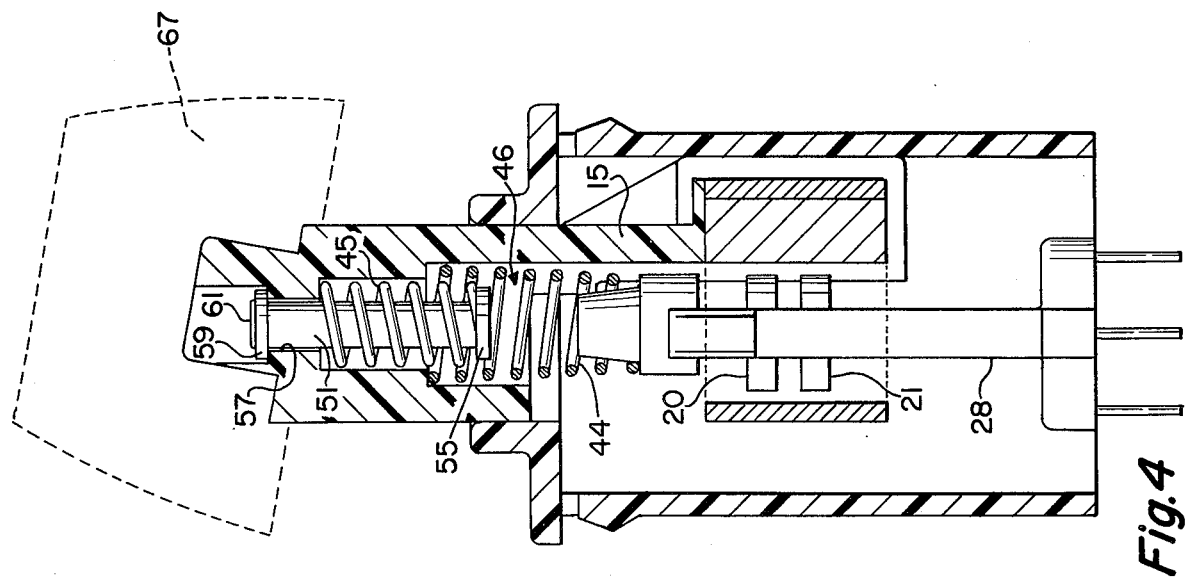
FIG. 4 is a cross-sectional view taken along the lines 4—4 of FIG. 3, with the actuator button undepressed.

The assembled keyswitch constructed in accordance with the present invention is shown in FIG. 1. The keyswitch 10 includes a housing 12 which receives a plunger and permanent magnet support member 14. This member may be constructed to support two spaced-apart permanent magnets that are magnetized on their faces with opposite polarities as shown in the aforementioned Bernin et al applications, or to support a single magnet 18 and a magnetically permeable shunt which contacts the magnet 18, as best shown in FIGS. 4 through 6. The shunt 19 is a U-shaped metallic member constructed of magnetically permeable material and is used to contain magnetic field within the switch to prevent affecting the magnetic properties of other nearby magnetic switches. The spaced-apart magnets or the magnet and U-shaped shunt, on the plunger and magnet support member 14, provide a relatively unidirectional field across a pair of toroidally-shaped saturable magnetic cores 20, 21.

The cores 20, 21 both have a drive line wire 22 passing through their center apertures. A U-shaped sense line wire 24 passes through the center aperture 23 of the upper core 20 while a U-shaped sense line wire 25 passes through the center aperture 33 of the lower core 21. The cores 20, 21, the drive line wire 22 and the sense line wires 24, 25 are all molded into the support 28 of the unitary support assembly 26. The housing 12, the plunger and magnetic support assembly 14 and the support 28 are all preferably formed of plastics.

The construction of the plunger and the magnetic support assembly 14 is best shown in FIGS. 2 and 4 through 6. The plunger 15 is returned to its initial upwardmost position following each depression of the plunger by the coil springs 44, the purpose of which is more fully described hereinafter. The spring 44 is a wound coil spring, the upper end of which is received in a cylindrical passageway 46 in the plunger 15 and it abuts the surface 47 of the passageway 46. The lower end of the spring 44 encircles a seat post 48 that is integrally formed on the support 28 and the spring 44 is thereby seated on the surface 49.

The spring 45 is a relatively high force coil spring, with respect to the spring 44. The upper end of the spring 45 abuts the surface 50 in the passageway 43 which extends from passageway 46 and is of a smaller diameter. A cylindrical pin 51, which is preferably made of metal such as brass and which has a lower head 55 formed thereon, is inserted through an aperture 57 in the plunger 15. An upper head member 59 is then secured to the upper end of the pin 51 to retain it in place. The head member 59 may be formed as a washer which is held in place by clinching the end 61 of the pin 51 to secure the head member 59 on the pin 51. The key button and support post may be positioned straight up or it may be slanted as best shown in FIGS. 4 through 6. The spring 45 encircles the pin 51 with its lower end resting against the head 55.

The switch 10 is secured in a keyboard aperture in a keyboard support plate (not shown) by the resilient arms 52 that are formed in the housing 12. The resilient arms 52 include the locking tabs 54 for locking the switch 10 in the keyboard support plate, thus, when the housing 12 is pressed downwardly into the aperture in the keyboard plate, the surface of the plate engages the lower angled surfaces 54a of the locking tabs 54 and the arms 52 thereby flex inwardly as the switch 10 is pressed into place. Once the housing 12 is in place, the arms 52 will unflex and the locking tabs 54 will retain the switch 10 in place in the keyboard support plate. To remove the switch 10 from the keyboard support plate, the arms 52 must be flexed inwardly by the application of sufficient force to the upper angled surfaces 54b of the locking tabs 54.

The saturable magnetic cores 20, 21 and the sense line and drive line wires 22, 24 and 25 are molded into the support 28 which is retained in the housing 12, thus, the terminal ends 22a, 22b, 24a, 24b, 25a and 25b of the substantially U-shaped drive and sense line wires 22, 24 and 25 may be secured into a printed circuit board with the support assembly 26 being removed from the housing 12.

The housing 12 is provided with guide channels 69 whereby the relatively thin support 28 may be removably positioned in the housing 12 through the bottom opening 38.

The removable support assembly 26 is held in place in the housing 12 by means of a snap-in lock construction consisting of the wedges 76, 77 which project into the apertures 89, 91 in the sides of the housing 12. The wedge 76 is formed on the top of a side leg 79 of the support 28 into which one of the lead segments sense line wire 25 is molded, while the wedge 77 is formed on the flexible arm 81.

Figure 2:
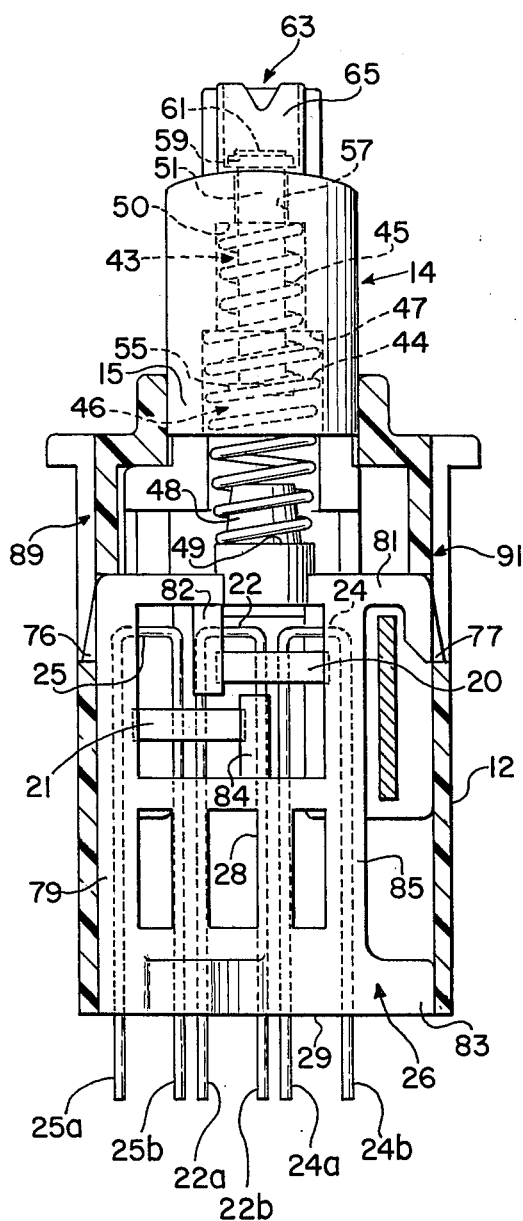
FIG. 2 is a cross-sectional view of the assembled switch taken along the lines 2—2 of FIG. 3.

The flexible arm 81 and the extension abutment 83 on the lower end of the support 28 allows the magnetic shunt 19 to pass inside of the arm 81 thereby facilitating positioning of the support 28 relative to the plunger and magnet support assembly 14. When the support 28 is positioned in place relative to the plunger and magnet support assembly 14, the magnetic field produced by the magnet 18 and formed by the shunt 19 is such that the support 28 will be automatically positioned by the field so that the cores 20, 21 are positioned substantially as shown in FIGS. 2 and 4. Since the spring 44 tends to drive the support 28 down away from the magnet 18 and the shunt 19, the downward motion of the support 28 is restrained by the arm 81.

Figure 3:
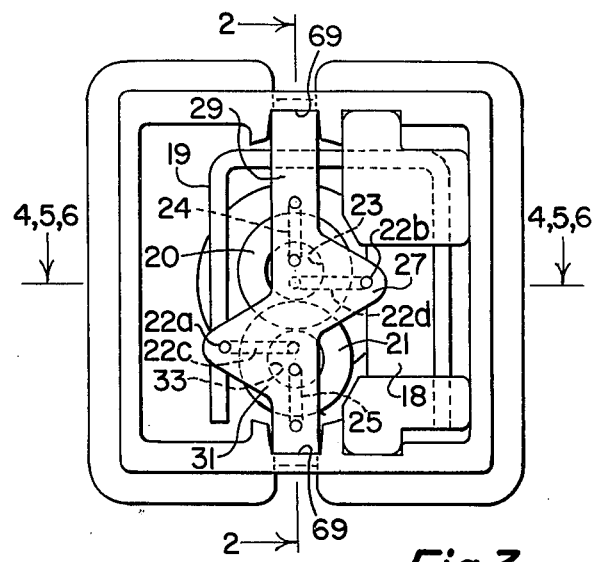
FIG. 3 is a bottom view of the switch of FIG. 1.

While the sense line and drive line wires are all generally U-shaped, the drive line wire 22 is formed in the described embodiment so as to conserve space in order to keep the size of the switch relatively small and the housing 12 of the same size as the housing of the switch of the Bernin et al application. The drive line wire 22, as best shown in FIG. 3, is a pair of offset bends 22c and 22d which bring the lead terminations 22a, 22b through the lands 31, 27 respectively, in the base 29 of the support 28, thereby allowing for sufficient clearance between the termination ends 22a, 22b and the termination ends 25a, 25b and 24a, 24b to provide adequate tolerance for reliable connections into printed circuit boards. The support 28 must be carefully designed so that the plastic material employed in constructing the support will not cause undue pressure on the cores 20, 21 upon shrinkage during molding. The diameter of the cores 21 may vary somewhat in size from one core to the next and if molded into the core without taking this into consideration unreliable performance and even failure of the switch may result. In order to avoid these problems, the flexible braces 82 and 84 are integrally formed on the support 28 so as to hold the cores between them and the legs 85 and 79 of the support 28, respectively. The flexible cantilever-shaped braces 82, 84 are free to give so as to relieve the molding pressure on the cores 20, 21.

The operation of the switch or selector of the present invention is best illustrated by FIGS. 4 through 6. In the initial unactivated position of FIG. 4, the cores 20, 21 are both held in saturated state due to the closed position of the magnet 18 and the shunt 19 relative to the cores whereby the field set up by the magnet 18 and the shunt causes magnetic saturation of both cores. Signals on the drive line wire 22 will not then be coupled to the sense line wires 24 or 25 because both of the cores 20, 21 are in saturation. The plunger and magnet support assembly 14 is biased to the position shown in FIG. 4 by the springs 44, and by the interaction of the magnetic field produced by the magnet 18 and the shunt 19 upon the wires 22, 24 and 25 of the support assembly 26.

If the key button 67 is depressed with a moderate amount of force, such as in a normal typing situation, the magnet 18 and the shunt 19 will be depressed sufficiently so that the core 20 will no longer be positioned between them, although the core 21 will be as shown in FIG. 5. The spring 44 will then be compressed while the spring 45 will not be or will only be slightly compressed and the head 55 of the pin 51 will be positioned adjacent the top of the post 48 at this time. The position of the magnet 18 and the magnetic shunt 19 in FIG. 5 allows the core 20 to come out of saturation and a signal on the drive line wire 22 will, therefore, be coupled into the sense line wire 24. The resulting output signal that is produced in this case indicates to the control circuitry of the keyboard (not shown) that actuation of the "single character" code has occurred.

If an additional force is now applied to depress the key button 67 downwardly, the head 55 will be retained against further downward motion by the top of the post 48 causing it to be forced upwardly in the opening 63, thereby causing the spring 45 to be compressed. Since the spring 45 requires more force to compress the spring 44, the additional force that is necessary will be relatively strong compared to the force needed to depress the plunger and magnet assembly 14 to the position shown in FIG. 5. With the plunger and magnet assembly depressed to the position shown in FIG. 6, both of the cores 20, 21 will be magnetically unsaturated and, therefore, both of the sense line wires 24 and 25 will receive coupled signals from the drive line wire 22. The signals that are received by the control circuitry will then indicate that both of the cores 20, 21 are unsaturated and that a "repeat character" code is to be generated as long as the button 67 remains fully depressed as shown in FIG. 6.

The invention is claimed as follows:

1. A keyboard switch comprising a housing, a depressible actuating member and at least one permanent magnet coupled to said actuating member so as to change the position of said magnet from an unactuated first position to an actuated second position representing a first condition when said actuating member is depressed, and to an actuated third position representing a second condition when said actuating member is further depressed, a unitary support assembly which is removable from said housing comprising first and second toroidal-shaped saturable magnetic cores with said first magnetic core being positioned above second magnetic core, at least one drive wire threaded through both of said cores, at least one sense wire threaded through each of said magnetic cores and a molded electrical insulating support element for supporting said magnetic cores and said drive and sense wires which are molded therein, said drive wires and said sense wires being configurated such that the terminating end of said drive and sense wires which extend out of said housing may be connected to a printed circuit board, a pin which is slideably positionable relative to said actuating member and having a head thereon, first and second spring means for biasing said actuating member to its unactuated position, said first spring means being positioned between said support element and said actuating member and said second spring means being positioned between said head of said pin and said actuating member, both of said magnetic cores being magnetically saturated when said permanent magnet is at its unactuated position, said first magnetic core being magnetically unsaturated and said second magnetic core being magnetically saturated when said permanent magnet is at its second position, at which said first bias spring is compressed and said second bias spring is relatively uncompressed, and said first magnetic core and said second magnetic core both being magnetically unsaturated when said permanent magnet is in its third position, at which both said first and second bias springs are compressed and said head of said pin is restrained against further downward motion by said support element.

2. A keyboard switch as claimed in claim 1, wherein said support element comprises a pair of integrally formed cantilever-shaped braces each of which acts to support one of said magnetic cores and are constructed to be flexible so as to relieve pressure on said supported core which would otherwise result from the molding of said support element.

3. A keyboard switch as claimed in claim 1, further comprising first and second interacting retention means on said housing and on said support element respectively, said housing and said retention means being constructed so that said unitary assembly may be selectively retained in said housing and selectively removed therefrom without disassembly of any other parts of said switch.

4. A keyboard switch as claimed in claim 1 comprising an integrally formed post on said support element and an internal passageway in said actuating member wherein said first bias spring is a coil spring, the upper end of which abuts against a surface of said passageway and the lower end of which engages a surface of said post.

5. A keyboard switch as claimed in claim 1, wherein said support element has a base with a pair of projecting lands formed thereon and said drive wire has a pair of offset bends to allow for the projection of each of the termination ends of said drive wire through one of said lands.

6. A keyboard switch as claimed in claim 1, wherein said actuating member comprises only one permanent magnet and a U-shaped magnetic shunt member that contacts said permanent magnet.

7. A keyboard switch as claimed in claim 6, wherein said unitary assembly comprises a flexible arm that carries a portion of said retention means.

8. A keyboard switch as claimed in claim 2, further comprising first and second interacting retention means on said housing and on said support element respectively, said housing and said retention means being constructed so that said unitary assembly may be selectively retained in said housing and selectively removed therefrom without disassembly of any other parts of said switch.

9. A keyboard switch as claimed in claim 8 comprising an integrally formed post on said support element and an internal passageway in said actuating member wherein said first bias spring is a coil spring, the upper end of which abuts against a surface of said passageway and the lower end of which engages a surface of said post.

10. A keyboard switch as claimed in claim 9, wherein said support element has a base with a pair of projecting lands formed thereon and said drive wire has a pair of offset bends to allow for the projection of each of the termination ends of said drive wire through one of said lands.

11. A keyboard switch as claimed in claim 10, wherein said actuating member comprises only one permanent magnet and a U-shaped magnetic shunt member that contacts said permanent magnet.

12. A keyboard switch as claimed in claim 11, wherein said unitary assembly comprises a flexible arm that carries a portion of said retention means.

* * * * *